(12) United States Patent
Yen et al.

(10) Patent No.: US 9,373,713 B2
(45) Date of Patent: Jun. 21, 2016

(54) SILICON CARBIDE SEMICONDUCTOR DEVICE AND METHOD OF MANUFACTURE THEREOF

(71) Applicant: Hestia Power Inc., Hsinchu (TW)

(72) Inventors: Cheng-Tyng Yen, Hsinchu (TW); Chien-Chung Hung, Hsinchu (TW); Yao-Feng Huang, Hsinchu (TW); Hsiang-Ting Hung, Hsinchu (TW); Chwan-Ying Lee, Hsinchu (TW)

(73) Assignee: HESTIA POWER INC., Hsinchu (TW)

( * ) Notice: Subject to any disclaimer, the term of this patent is extended or adjusted under 35 U.S.C. 154(b) by 0 days.

(21) Appl. No.: 14/612,782

(22) Filed: Feb. 3, 2015

(65) Prior Publication Data
US 2016/0141412 A1    May 19, 2016

(30) Foreign Application Priority Data
Nov. 19, 2014 (TW) .............................. 103140001 A

(51) Int. Cl.
*H01L 31/0312* (2006.01)
*H01L 29/78* (2006.01)
*H01L 29/739* (2006.01)
*H01L 29/66* (2006.01)
(Continued)

(52) U.S. Cl.
CPC ........ *H01L 29/7816* (2013.01); *H01L 21/0223* (2013.01); *H01L 21/0274* (2013.01); *H01L 21/02529* (2013.01); *H01L 21/266* (2013.01); *H01L 21/28035* (2013.01); *H01L 21/324* (2013.01); *H01L 29/1041* (2013.01); *H01L 29/1608* (2013.01); *H01L 29/4916* (2013.01); *H01L 29/66325* (2013.01); *H01L 29/66681* (2013.01); *H01L 29/7393* (2013.01)

(58) Field of Classification Search
CPC ................... H01L 2924/0002; H01L 2924/00; H01L 29/1608; H01L 29/1095; H01L 29/66068; H01L 29/7811; H01L 29/0615; H01L 29/0619; H01L 29/0634; H01L 29/0638; H01L 29/402
USPC .......................................................... 257/77
See application file for complete search history.

(56) References Cited

U.S. PATENT DOCUMENTS 6,071,781 A * 6/2000 Nakajima ........... H01L 21/2652
                                                     257/E21.337
7,687,825 B2 * 3/2010 Zhang ................. H01L 29/7395
                                                     257/134
(Continued)

OTHER PUBLICATIONS

Salemi et al., "The effect of defects and their passivation on the density of states of the 4H-silicon-carbide/silicon-dioxide interface", Journal of Applied Physics, Feb. 1, 2013, pp. 053703-1-053703-6, vol. 113.

(Continued)

*Primary Examiner* — Tod T Van Roy
*Assistant Examiner* — Vu A Vu
(74) *Attorney, Agent, or Firm* — Muncy, Geissler, Olds & Lowe, P.C.

(57) ABSTRACT

A silicon carbide semiconductor device and method of manufacture thereof is made by providing a channel control zone which has impurity concentration distribution increased gradually from a first doping boundary to reach a maximum value between the first doping boundary and a second doping boundary, then decreased gradually toward the second doping boundary, so that the silicon carbide semiconductor device is formed with a lower conduction resistance and increased drain current without sacrificing threshold voltage.

19 Claims, 10 Drawing Sheets

(51) Int. Cl.
*H01L 29/16* (2006.01)
*H01L 29/10* (2006.01)
*H01L 21/266* (2006.01)
*H01L 21/28* (2006.01)
*H01L 21/027* (2006.01)
*H01L 21/02* (2006.01)
*H01L 21/324* (2006.01)
*H01L 29/49* (2006.01)

(56) References Cited

U.S. PATENT DOCUMENTS 7,982,224 B2 * 7/2011 Kudou .............. H01L 29/66068
257/328

2009/0283827 A1 * 11/2009 Pendharkar ......... H01L 29/0847
257/343

OTHER PUBLICATIONS

Li et al., "Effect of NO Annealing Conditions on Electrical Characteristics of n-type 4H-SiC MOS Capacitors", Journal of Electronic Materials, 2000, pp. 1027-1032, vol. 29, No. 8.
Dai Okamoto, "Improved Inversion Channel Mobility in 4H-SiC MOSFETs on Si Face Utilizing Phosphorus-Doped Gate Oxi", IEEE Electron Device Letters, Jul. 2010, pp. 710-712, vol. 31, No. 7.
Sharma et al., "Phosphorous passivation of the SiO2/4H-SiC interface", Solid-State Electronics, Nov. 16, 2011, pp. 103-107, vol. 68.

* cited by examiner

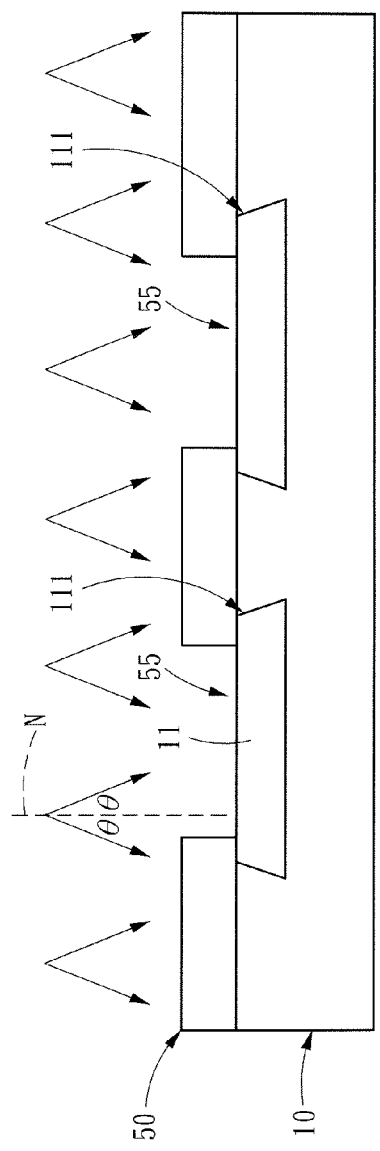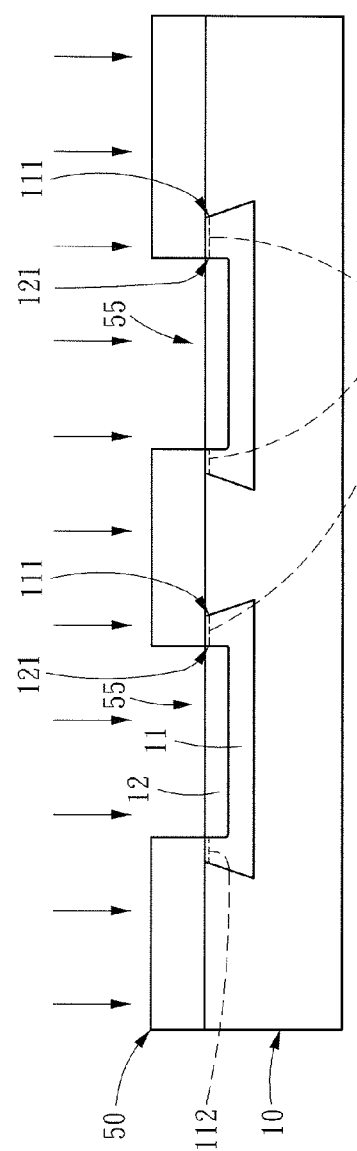
Fig. 6C
Fig. 6D

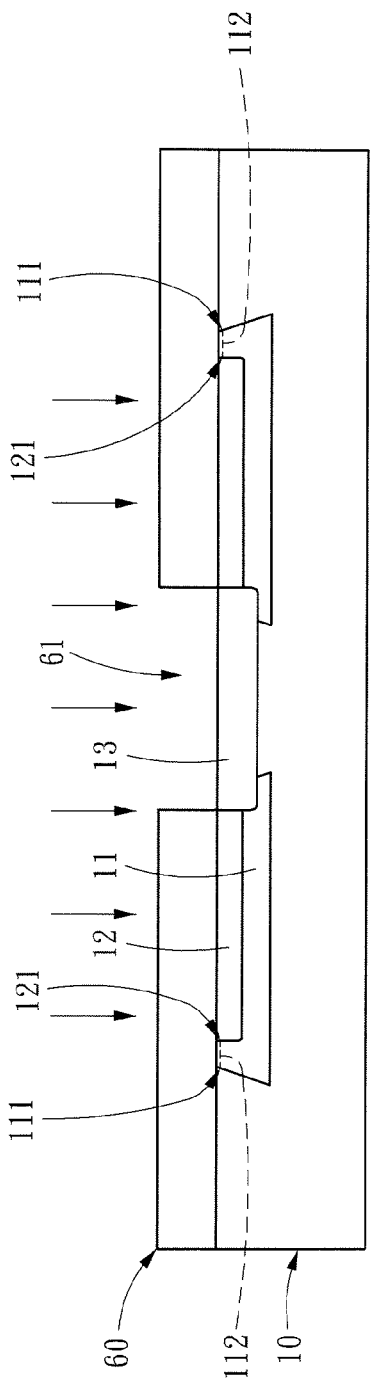
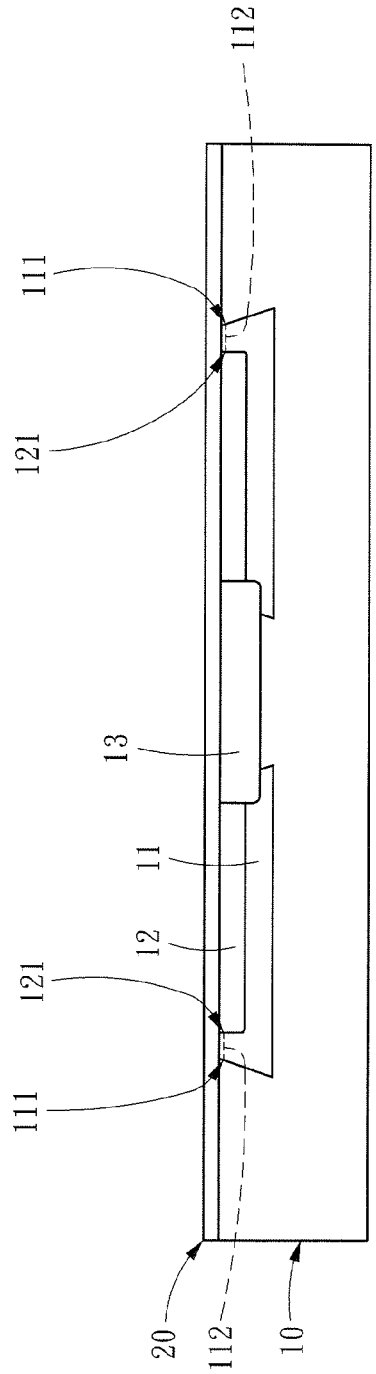
Fig. 6E
Fig. 6F

SILICON CARBIDE SEMICONDUCTOR DEVICE AND METHOD OF MANUFACTURE THEREOF

FIELD OF THE INVENTION

The present invention relates to a semiconductor device and particularly to a silicon carbide semiconductor device and method of manufacture thereof.

BACKGROUND OF THE INVENTION

Semiconductor power devices, in terms of blocking voltage in design, should provide characteristics of minimum conduction resistance, lower reverse leakage current and faster switching speed to reduce conduction loss and switching loss during operation. Silicon carbide (SiC) has characteristics of a wide energy band gap (for instance, Eg of 4H—SiC can reach 3.26 eV), a higher critical field of dielectric breakdown (2.2 MV/cm) and a higher thermal conduction coefficient (4.9 W/cm-K), hence is deemed an excellent material for making power switching devices. Silicon carbide also is the only compound semiconductor can form thermally grown oxides, hence is suitable for manufacturing MOS controlled switches such as MOSFET (metal oxide semiconductor field effect transistor) and IGBT (insulated gate bipolar transistor).

However, during the thermal oxidation of SiC, the unreacted carbon will remain at the interface and inside of oxide as defects in the form of silicon vacancies, carbon clusters and carbon interstitials, and create energy states in the band gap. These defect states will become acceptor-like traps or donor-like traps at the interface. In general, SiC MOSFET are n-channel MOSFETs. When inversion channel is formed on the p-well, the electrons will be captured by acceptor-like traps near the conduction band, and the density of electrons available for conducting electric current will be reduced. In the meantime the acceptor-like traps filled with electrons will become negatively charged, and cause significant Coulomb scattering of electrons. The reduced electron density and significant Coulomb scattering explain the very low channel mobility and high conduction resistance of SiC MOSFET. Approaches of improving channel mobility and conduction resistance include passivation of the interface traps by post-oxidation annealing with nitric oxide (NO), nitrous oxide ($N_2O$) or POCl3. Non-patent references can be found as follows:

[1] S. Salemi, N. Goldsman, D. P. Eittsserry, A. Akturk, A. Lelis, "The effect of defects and their passivation on the density of states of the 4H-silicon-carbide/silicon-dioxide interface" *J. Appl. Phys.* 113, 053703, 2013.
[2] H.-F. LI, S. Dimitrijev, D. Sweatman, and H. B. Harrison, "Effect of NO Annealing Conditions on Electrical Characteristics of n-type 4H—SiC-MOS Capacitors" *Journal of Electronic Materials*, Vol. 29, No. 8, 2000, p. 1027.
[3] D. Okamoto, H. Yano, K. Hirata, T. Hatayama, T. Fuyuki, "Improved Inversion Channel Mobility in 4H—SiC-MOSFETs on Si Face Utilizing Phosphorus-Doped Gate Oxide" *IEEE Electron Device Letters*, Vol. 31, No. 7, July 2010, p. 710.
[4] Y. K. Sharma, A. C. Ahyi, T. Issacs-Smith, X. Shen, S. T. Pantelides, X. Zhu, L. C. Feldman, J. Rozen, J. R. Williams, "Phosphorous passivation of the $SiO_2$/4H—SiC interface" *Solid-State Electronics*, 68, 103, 2012.

However, the current approaches of improving channel mobility usually face the trade-off between low conduction resistance and high threshold voltage. A low threshold voltage increases the risk of falsely turn-on during operation of devices.

SUMMARY OF THE INVENTION

The primary object of the present invention is to maintain a definite threshold voltage while reducing conduction resistance to avoid the risk of falsely turn-on during operation of devices.

To achieve the foregoing object the present invention provides a silicon carbide semiconductor device that includes a first semiconductor layer, a second semiconductor layer, an insulation layer, a gate electrode, a first doping zone, a second doping zone and a third doping zone. The first semiconductor layer has a first conductivity. The second semiconductor layer is located on the first semiconductor layer. The insulation layer is located on the second semiconductor layer. The gate electrode is located on the insulation layer. The first doping zone has a second conductivity opposite to the first conductivity and is located in the first semiconductor layer along the second semiconductor layer, and includes a first doping boundary. The second doping zone has the first conductivity and is located in the first doping zone along the second semiconductor layer and includes a second doping boundary. The third doping zone has the second conductivity and is located in the first semiconductor layer along the second semiconductor layer and abutting the second doping zone, and partially overlaps with the first doping zone.

Wherein, the first doping zone includes a channel control zone along the second semiconductor layer and between the first doping boundary and the second doping boundary.

Wherein, the channel control zone includes impurity concentration distribution that increases gradually from the first doping boundary to reach a maximum value between the first doping boundary and the second doping boundary, then gradually decreases toward the second doping boundary.

To achieve the foregoing object the invention also provides a method for manufacturing a silicon carbide semiconductor device that includes the steps as follows:

Step 1: Provide a first semiconductor layer with a first conductivity;

Step 2: Provide a first mask on the first semiconductor layer;

Step 3: Provide a first ion implantations on the first semiconductor layer through the first mask to form a first doping zone which has a second conductivity and a first doping boundary;

Step 4: Provide a second ion implantations on the first doping zone through the first mask to form a second doping zone which has the first conductivity and a second doping boundary;

Step 5: Provide a third ion implantations on the first semiconductor layer through a second mask to form a third doping zone which has the second conductivity;

Step 6: Form a second semiconductor layer on the first semiconductor layer;

Step 7: Form an insulation layer on the second semiconductor layer; and

Step 8: Form a gate electrode layer on the insulation layer.

Wherein, the first ion implantations is performed in an incident direction which forms an included angle with a normal line of the first semiconductor layer so that a channel control zone is formed along the second semiconductor layer between the first doping boundary and the second doping boundary. The channel control zone includes impurity concentration distribution that increases gradually from the first doping boundary to reach a maximum value between the first doping boundary and the second doping boundary, then gradually decreases toward the second doping boundary.

Thus, through the channel control zone with the impurity concentration distribution increased gradually from the first doping boundary to reach the maximum value between the first doping boundary and the second doping boundary, then gradually decreased toward the second doping boundary, the silicon carbide semiconductor device of the present invention can improve conduction resistance and increase drain current without sacrificing the threshold voltage and avoid the risk of falsely turn-on during operations.

The foregoing, as well as additional objects, features and advantages of the invention will be more readily apparent from the following detailed description, which proceeds with reference to the accompanying drawings.

BRIEF DESCRIPTION OF THE DRAWINGS

FIGS. 6A through 6I are schematic views of an embodiment of the invention showing sequence of manufacturing processes.

DETAILED DESCRIPTION OF THE PREFERRED EMBODIMENTS

Figure 1:
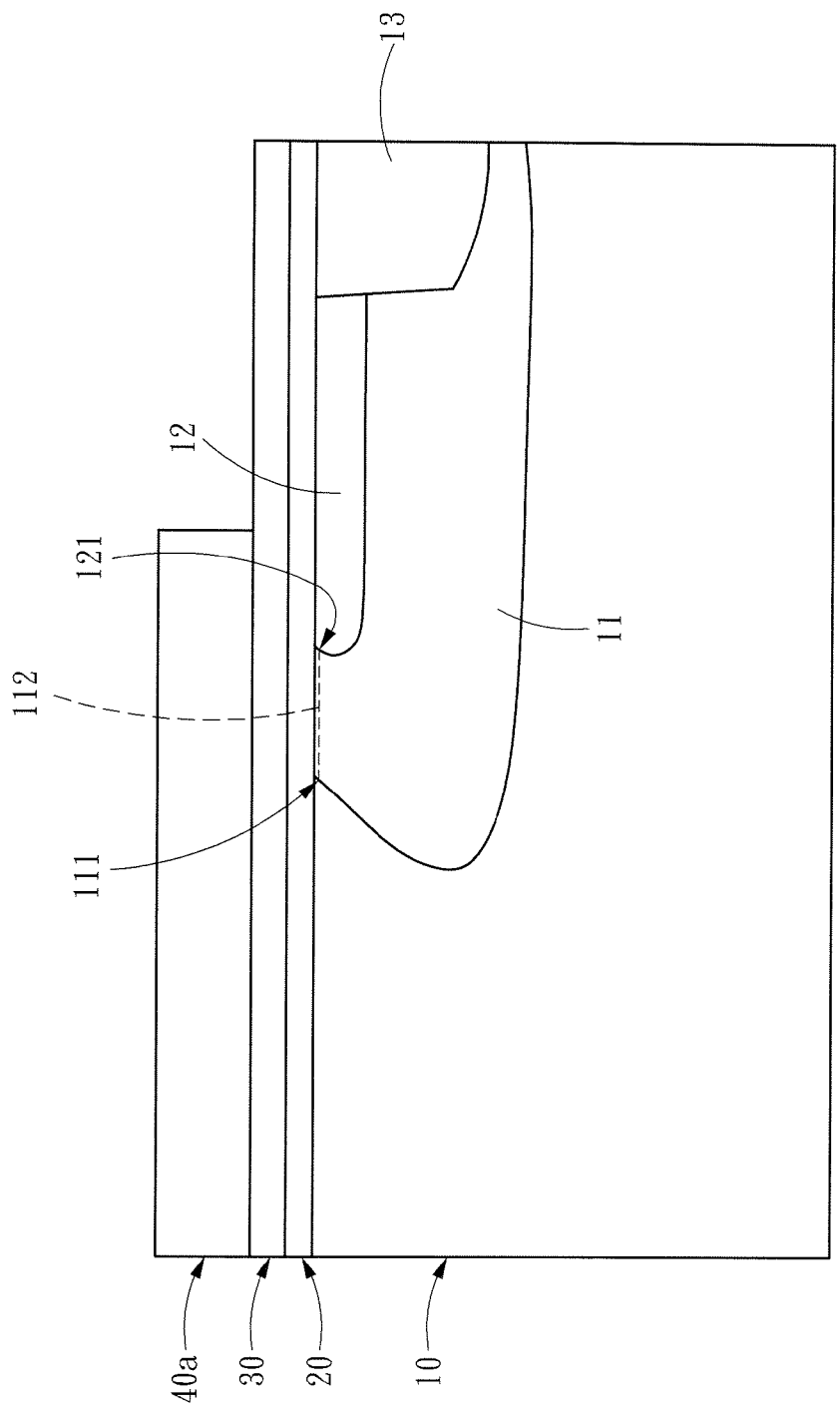
FIG. 1 is a schematic view of the structure of a first embodiment of the invention.

Please refer to FIG. 1 for the structure of a first embodiment of the invention. The invention aims to provide a silicon carbide semiconductor device that includes a first semiconductor layer 10, a second semiconductor layer 20, an insulation layer 30, a gate electrode 40a, a first doping zone 11, a second doping zone 12 and a third doping zone 13. The first semiconductor layer 10 can be made from silicon carbide and has a first conductivity such as n-type. The second semiconductor layer 20 is located on the first semiconductor layer 10 and also can be made from silicon carbide with a thickness ranged from 0.01 μm to 0.5 μm and an impurity concentration ranged from $1\times10^{15}$ cm$^{-3}$ to $1\times10^{20}$ cm$^{-3}$. The insulation layer 30 is located on the second semiconductor layer 20 and can be made from silicon oxide, silicon oxynitride, silicon nitride, aluminum oxide or aluminum nitride. The gate electrode 40a is located on the insulation layer 30 and can be made from a heavily doped n-type polysilicon or a heavily doped p-type polysilicon.

The first doping zone 11 has a second conductivity opposite to the first conductivity, such as p-type, and is located in the first semiconductor layer 10 along the second semiconductor layer 20, and has an impurity concentration ranged from $1\times10^{17}$ cm$^{-3}$ to $1\times10^{20}$ cm$^{-3}$, and also includes a first doping boundary 111 formed in the first semiconductor layer 10. The second doping zone 12 has the first conductivity, such as n-type, and is located in the first doping zone 11 along the second semiconductor layer 20, and has an impurity concentration ranged from $5\times10^{18}$ cm$^{-3}$ to $1\times10^{20}$ cm$^{-3}$, and also includes a second doping boundary 121. The third doping zone 13 has the second conductivity, such as p-type, and is located in the first semiconductor layer 10 along the second semiconductor layer 20 and abutting the second doping zone 12, and partially overlaps with the first doping zone 11, and has an impurity concentration ranged from $1\times10^{18}$ cm$^{-3}$ to $1\times10^{20}$ cm$^{-3}$.

Figure 2:
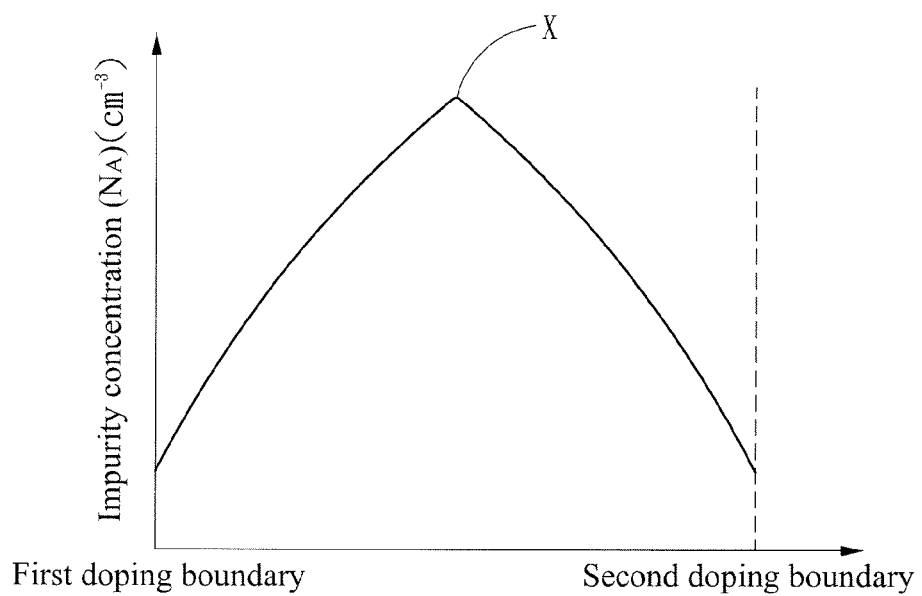
FIG. 2 is a schematic view of impurity concentration distribution of a channel control zone of the first embodiment of the invention.

The present invention further includes a channel control zone 112 along the second semiconductor layer 20 and between the first doping boundary 111 and the second doping boundary 121. The channel control zone 112 has impurity concentration distribution that increases gradually from the first doping boundary 111 to reach a maximum value X between the first doping boundary 111 and the second doping boundary 121, then gradually decreases toward the second doping boundary 121, as shown in FIG. 2 for the impurity concentration distribution of the channel control zone in the first embodiment. The horizontal axis starts at the first doping boundary 111 and ends at the second doping boundary 121. The vertical axis represents the impurity concentration $N_A$(cm$^{-3}$). Between the first doping boundary 111 and the second doping boundary 121 the impurity concentration distribution has the maximum value X. In the invention the impurity concentration distribution means that the impurity concentration is distributed from the first doping boundary 111 to the second doping boundary 121 on a plane zone in the first doping zone 11 parallel with the surface thereof and proximate the surface (i.e., the channel control zone 112 shown in FIG. 2). The maximum value X of impurity concentration ranges from $1\times10^{17}$ cm$^{-3}$ to $1\times10^{20}$ cm$^{-3}$, depending on the desired threshold voltage.

Figure 3:
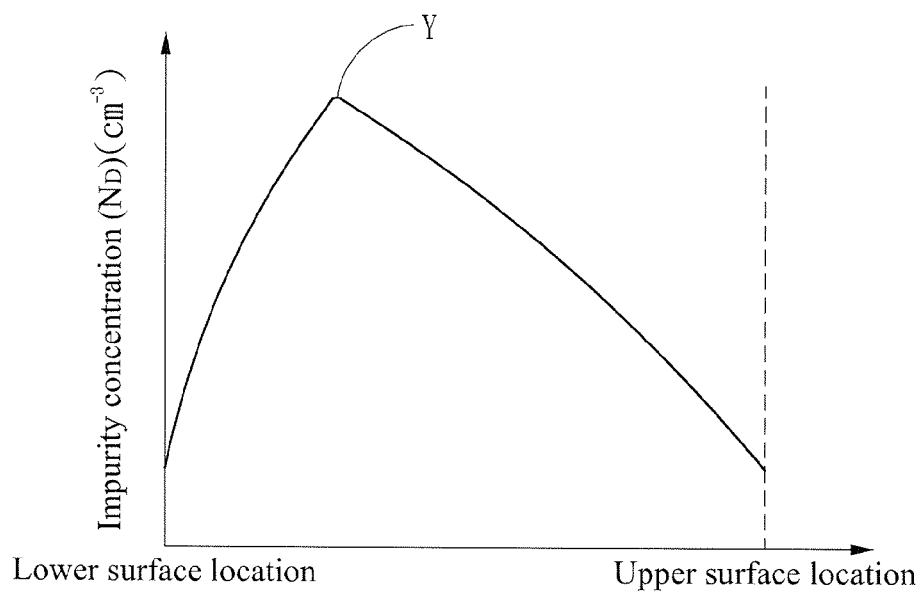
FIG. 3 is a schematic view of impurity concentration gradient distribution of the second semiconductor layer in the first embodiment of the invention.

Furthermore, in the first embodiment the impurity concentration of the second semiconductor layer 20 can form a gradient distribution in a thickness direction, with a peak value Y near the first semiconductor layer 10, as shown in FIG. 3, with the horizontal axis starts from a lower surface of the second semiconductor layer 20 near the first semiconductor 10 and ends at an upper surface of the second semiconductor layer 20 near the insulation layer 30. The vertical axis represents the impurity concentration $N_D$(cm$^{-3}$), with the peak value Y near the lower surface of the first semiconductor layer 10.

Figure 4:
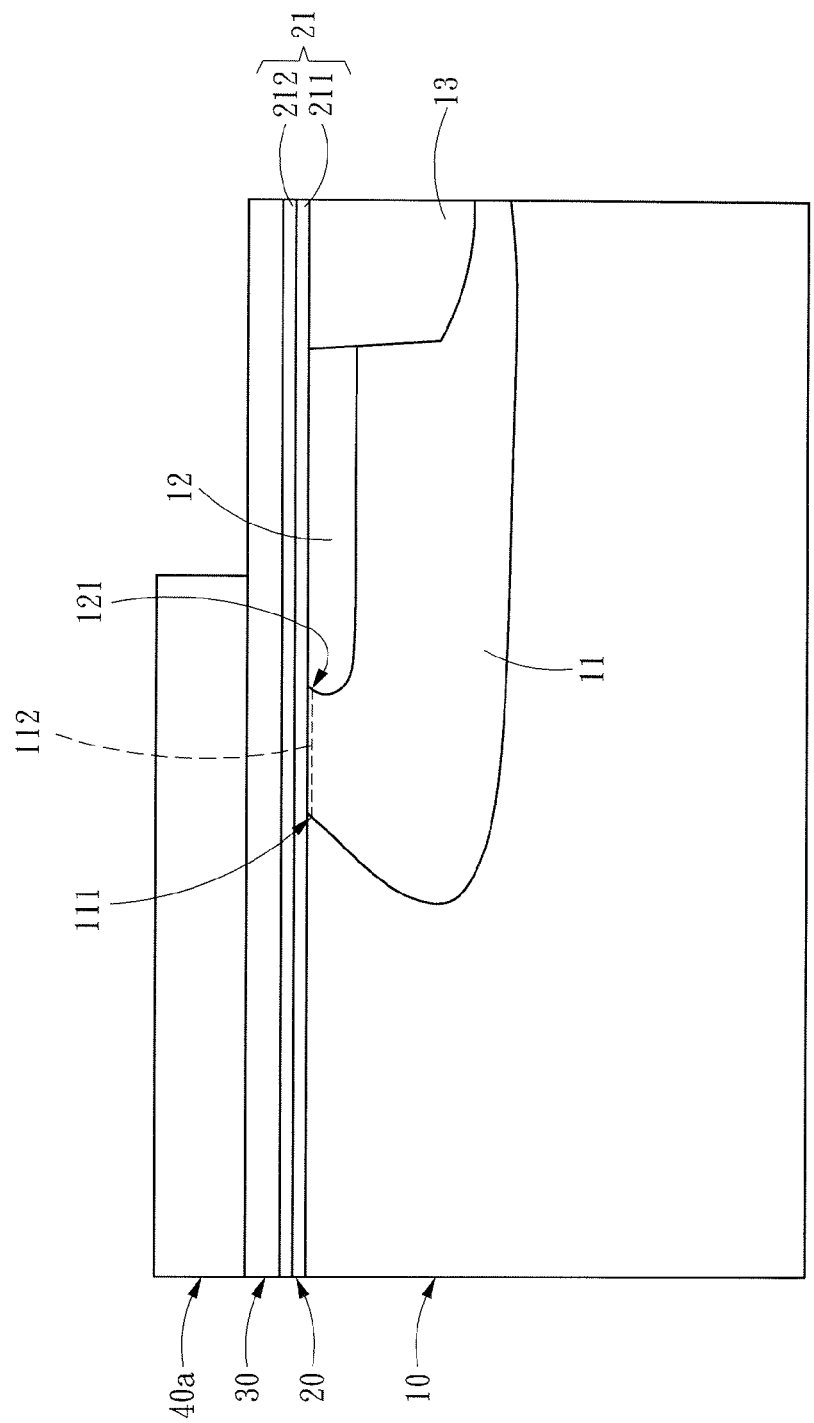
FIG. 4 is a schematic view of the structure of a second embodiment of the invention.

Please refer to FIG. 4 for the structure of a second embodiment of the invention. Compared with the first embodiment previously discussed, in the second embodiment the second semiconductor layer 20 further includes a plurality of epitaxy layers 21 which can include, as an example, a first channel layer 211 and a second channel layer 212. The first channel layer 211 is located on a first semiconductor layer and has the first conductivity and a first impurity concentration, while the second channel layer 212 is located on the first channel layer 211 and has a second impurity concentration lower than the first impurity concentration; and the second channel layer 212 can have the first conductivity or the second conductivity, with no restriction.

In addition, it is to be noted that, in the invention the structure configuration of the silicon carbide semiconductor device that consists of the first semiconductor layer 10, the second semiconductor layer 20, the insulation layer 30, the gate electrode 40a, the first doping zone 11, the second doping zone 12 and the third doping zone 13 can be arranged to form a MOSFET or an IGBT. Please refer to FIG. 5 for simulations of ID-VG characteristics of MOSFETs with the channel control zone 112 fabricated by different conditions through the invention. As shown in the chart, through adjusting the impurity concentration distribution of the channel control zone 112 by different conditions, a higher drain current (ID) and a higher threshold voltage ($V_{th}$) can be obtained simultaneously (Condition 2 shows both a higher ID and a higher $V_{th}$ than Condition 1). Hence the risk of falsely turn-on during operation of the devices can be avoided.

Figure 6A:
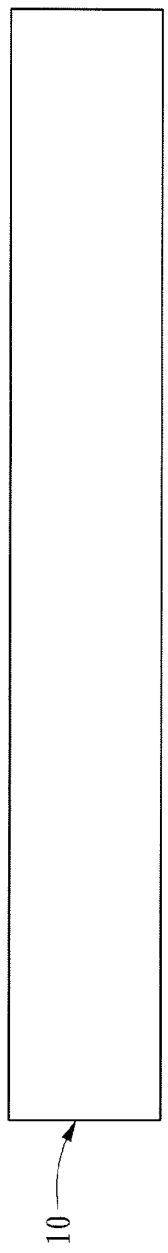

Please refer to FIGS. 6A through 6I for the processes of a method for manufacturing silicon carbide semiconductor devices according to the invention. It includes the steps as follows:

Step 1: Provide the first semiconductor layer 10 with the first conductivity, as shown in FIG. 6A.

Figure 6B:
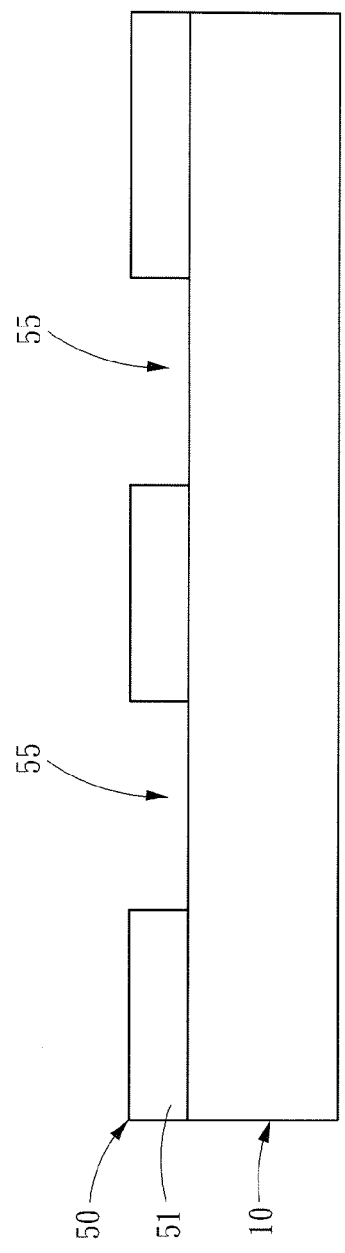
Figure 7A:
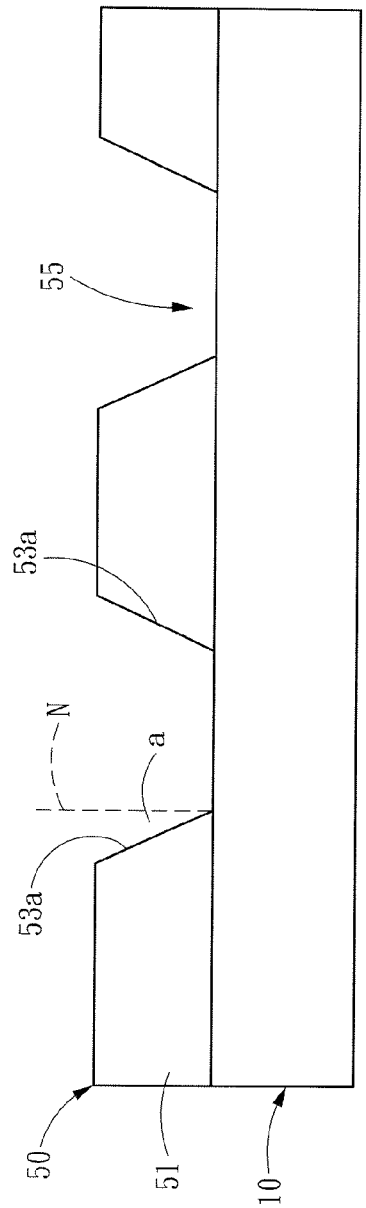
FIGS. 7A through 7C are schematic views of inclined sidewalls and stepped sidewalls of an embodiment of the invention.
Figure 7B:
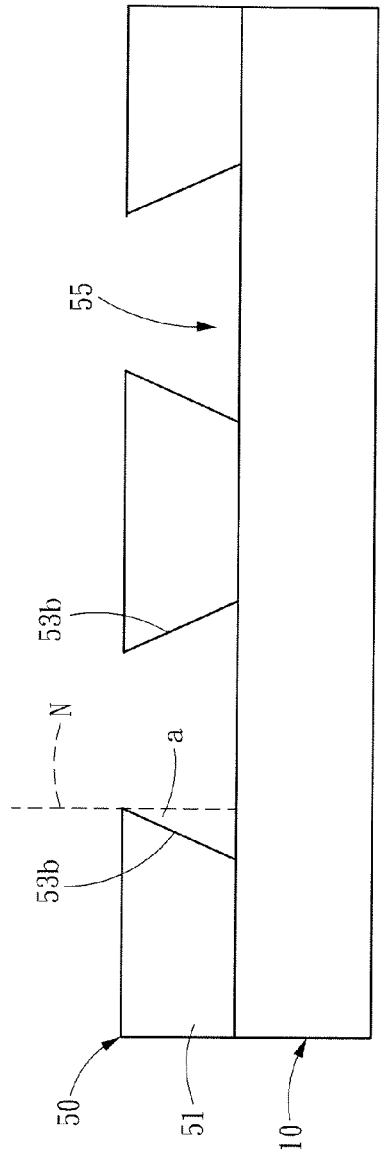
Figure 7C:
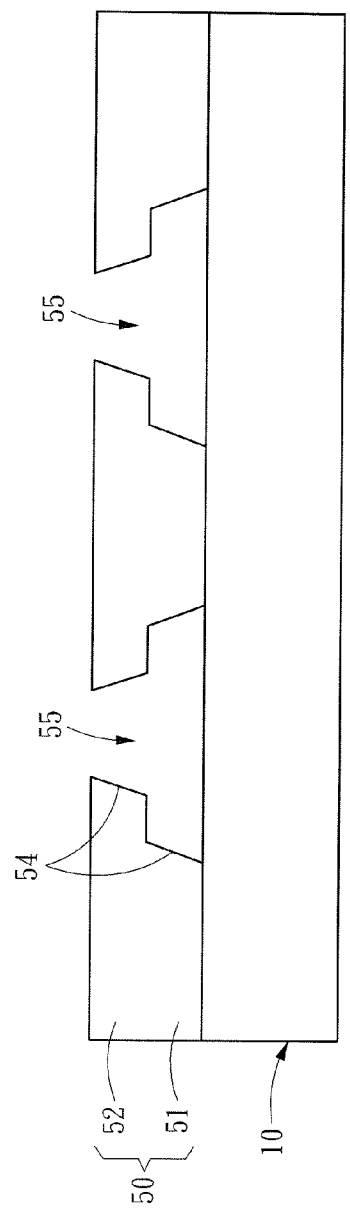

Step 2: Provide a first mask 50 on the first semiconductor layer 10. Referring to FIG. 6B, first provide a first mask layer 51 on the first semiconductor layer 10; next, form a plurality of first openings 55 on the first mask layer 51 via a photolithography process to form the first mask 50 on the first semiconductor layer 10 that can include inclined sidewalls 53a as shown in FIG. 7A, or another type of inclined sidewalls 53b as shown in FIG. 7B, that serve merely for illustrative purpose here; the first mask 50 also can have vertical side walls as shown in FIG. 6B. The inclined sidewalls 53a and 53b form respectively an acute angle "a" with a normal line N of the first semiconductor layer 10. The acute angle "a" is ranged from 2 degrees to 45 degrees. Each inclined sidewall 53a has a positive slope, while the another inclined side wall 53b has a negative slope. Or as shown in FIG. 7C, a second mask layer 52 may be provided on the first mask layer 51, then proceed the photolithography process on the first mask layer 51 and the second mask layer 52 to form the first openings 55 to form the first mask 50. Then a stepped sidewall 54 can be selectively formed on the first mask 50 as shown in FIG. 7C. The stepped side wall 54 allows the first mask 50 to form a lower layer portion (the first mask layer 51) and an upper layer portion (the second mask layer 52) wider than the lower layer portion.

Step 3: Referring to FIG. 6C, provide a first ion implantations through the first mask 50 on the first semiconductor layer 10 to form the first doping zone 11 with the second conductivity and the first doping boundary 111. In this embodiment a dopant used in the first ion implantations can be aluminum or boron, and an incident direction of the first ion implantations forms an included angle θ with the normal line N of the first semiconductor layer 10. The included angle θ is ranged from 2 degrees to 60 degrees. Through the first mask 50 the dopants are implanted into the first semiconductor layer 10 to form the first doping zone 11 as shown in FIG. 6C for illustrative purpose. In actual practice of ion implantations, the incident direction of the first ion implantations can be fixed, and the first semiconductor layer 10 is rotated against the incident direction to form the first doping zone 11.

Step 4: Referring to FIG. 6D, provide a second ion implantations through the first mask 50 on the first doping zone 11 to form the second doping zone 12 with the first conductivity and the second doping boundary 121. In this embodiment, a dopant of the second ion implantations can be phosphorus or nitrogen, and is implanted at an incident angle parallel with the normal line N of the first semiconductor layer 10 on the first doping zone 11 through the first mask 50.

Step 5: Referring to FIG. 6E, provide a third ion implantations through a second mask 60 on the first semiconductor layer 10 to form the third doping zone 13 with the second conductivity. The second mask 60 has a second openings 61. A dopant of the third ion implantations can be aluminum or boron, and is implanted through the second mask 60 into the first semiconductor layer 10 to form the third doping zone 13. The third doping zone 13 is abutting the second doping zone 12, and partially overlaps with the first doping zone 11.

Step 6: Referring to FIG. 6F, form the second semiconductor layer 20 on the first semiconductor layer 10. The second semiconductor layer 20 is formed via epitaxy growth at a temperature greater than 1500 degree Celsius.

Figure 6G:
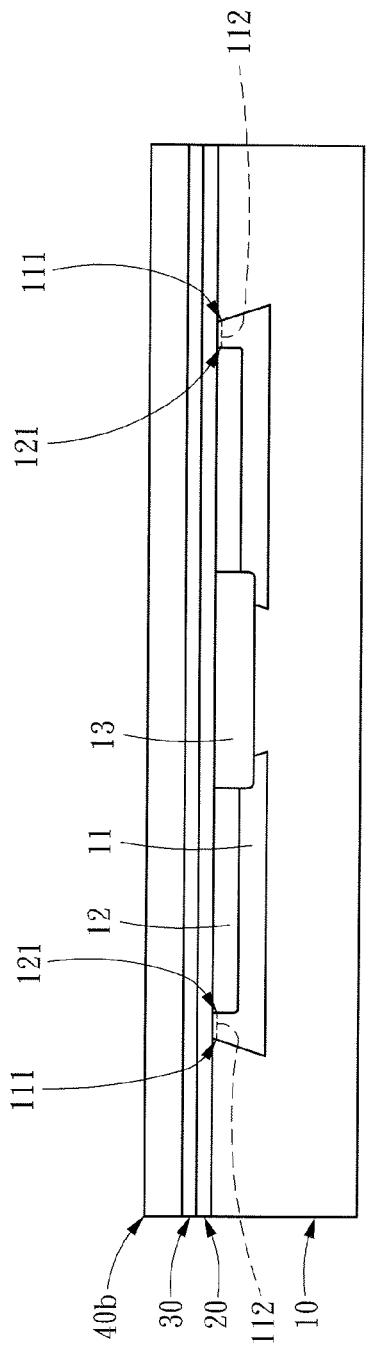
Figure 6H:
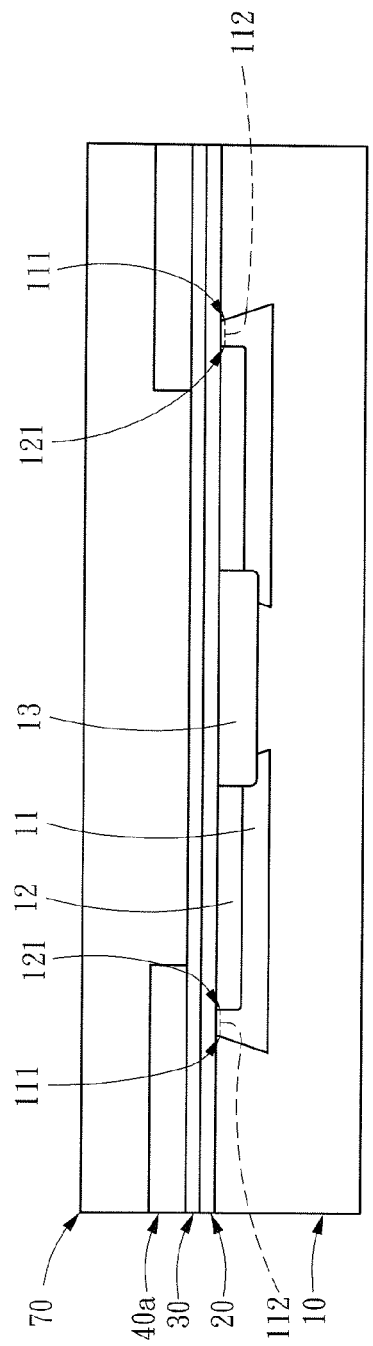
Figure 6I:
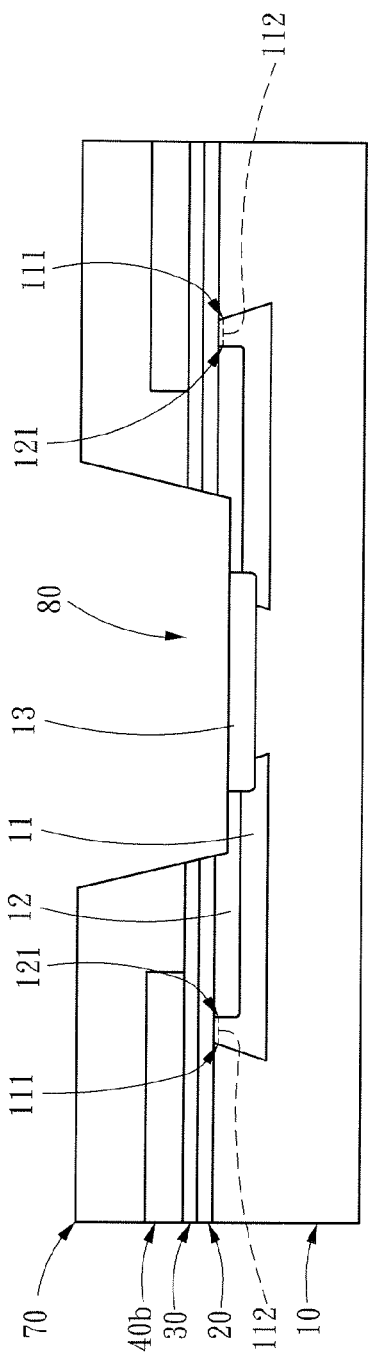

Step 7: Referring to FIG. 6G, form the insulation layer 30 on the second semiconductor layer 20 through a heated reaction or deposition approach such as thermal oxidation, chemical vapor deposition or atomic layer deposition (ALD) to form silicon oxide, silicon oxynitride, silicon nitride, aluminum oxide or aluminum nitride layer, then perform a post-oxidation or post-deposition annealing in an ambient gas including nitrous oxide, nitric oxide, nitrogen, argon, ammonia, hydrogen, water, phosphine or phosphoryl chloride.

Step 8: Referring to FIG. 6G, form a gate electrode layer 40b on the insulation layer 30. The gate electrode layer 40b is formed by depositing a gate electrode material, such as highly doped n-type polysilicon or highly doped p-type polysilicon followed by a photolithography process and a partial oxidization process thereafter.

Figure 5:
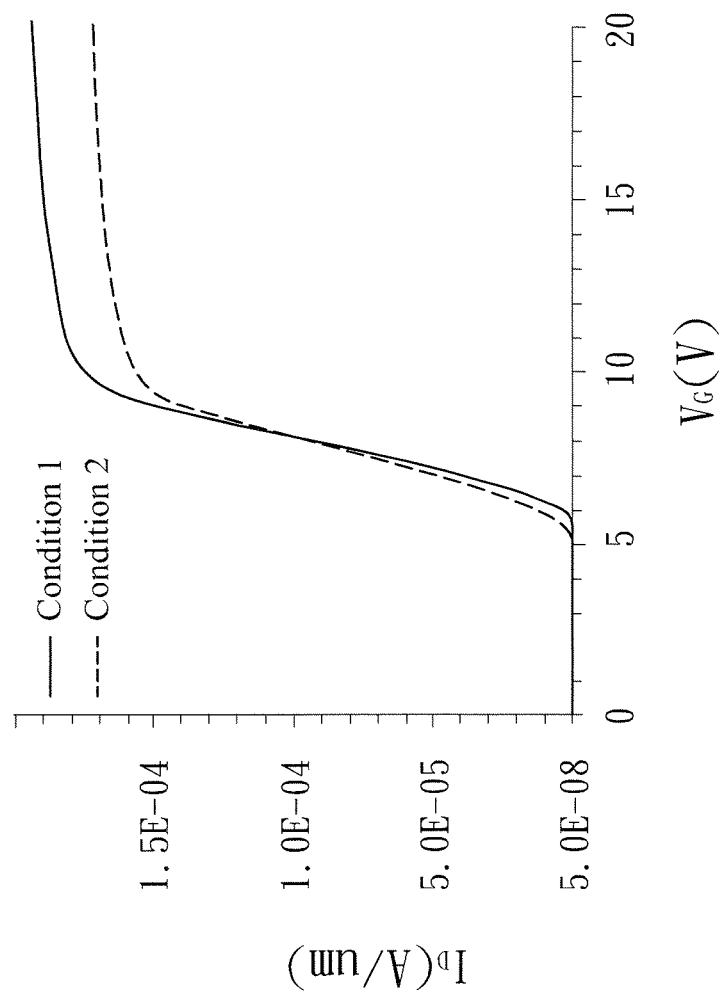
FIG. 5 is a simulation of ID-VG characteristics of MOSFETs with channel control zones fabricated by different conditions.

In this embodiment, it is to be noted that, because the first ion implantations is provided in the incident direction which forms the included angle θ with the normal line N of the first semiconductor layer 10, the channel control zone 112 can be formed along the second semiconductor layer 20 between the first doping boundary 111 and the second doping boundary 121, and the channel control zone 112 has the impurity concentration distribution increased gradually from the first doping boundary 111 to reach the maximum value X between the first doping boundary 111 and the second doping boundary 121, then decreased gradually toward the second doping boundary 121. After optimization of the thickness and concentration gradient distribution of the second semiconductor layer 20, and the implantation energy and dose of the first ion implantions, an optimal impurity concentration distribution of the channel control zone 112 can be achieved to reduce the conduction resistance and increase the threshold voltage at the same time as shown in FIG. 5.

Moreover, in this embodiment the method for manufacturing the silicon carbide semiconductor device can further include:

Step 9: Provide an isolation layer 70 to cover the insulation layer 30 and the gate electrode layer 40b. The isolation layer 70 can be made from tetraethoxysilane (TEOS), boron phosphorous silicon glass (BPSG), phosphorous silicon glass (PSG), silicon nitride or nitrogen-rich silicon to serve as a pre-metal dielectric (PMD) layer.

Step 10: Form a contact window 80 run through the isolation layer 70, the insulation layer 30 and the second semiconductor layer 20 to form a source contact with desired Ohmic contact characteristics.

As a conclusion, the invention, through the channel control zone which has the impurity concentration distribution increased gradually from the first doping boundary to reach the maximum value between the first doping boundary and the second doping boundary, then decreased gradually toward the second doping boundary, can improve the conduction resistance and increase the drain current of the silicon carbide semiconductor device without sacrificing the threshold voltage, thus avoid the risk of falsely turn-on during operation of the devices. It provides significant improvements over the conventional techniques.

While the preferred embodiments of the invention have been set forth for the purpose of disclosure, they are not the limitation of the invention, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A silicon carbide semiconductor device, comprising:
   a first semiconductor layer having a first conductivity;
   a second semiconductor layer located on the first semiconductor layer;
   an insulation layer located on the second semiconductor layer;
   a gate electrode located on the insulation layer;
   a first doping zone having a second conductivity opposite to the first conductivity and a first doping boundary and being located in the first semiconductor layer along the second semiconductor layer;
   a second doping zone having the first conductivity and a second doping boundary and being located in the first doping zone along the second semiconductor layer; and
   a third doping zone having the second conductivity and being located in the first semiconductor layer along the second semiconductor layer and abutting the second doping zone and partially overlapped with the first doping zone;
   wherein the first doping zone includes a channel control zone located along the second semiconductor layer between the first doping boundary and the second doping boundary;
   wherein the channel control zone has impurity concentration distribution increased gradually from the first doping boundary to reach a maximum value between the first doping boundary and the second doping boundary, then decreased gradually toward the second doping boundary;
   wherein the impurity concentration of the second semiconductor layer forms a gradient distribution in a thickness direction thereof;
   wherein the gradient distribution has a peak value proximate the first semiconductor layer.

2. The silicon carbide semiconductor device of claim 1, wherein the channel control zone is formed from the first doping boundary along the second semiconductor layer to the second doping boundary at a length ranged from 0.1 µm to 1 µm.

3. The silicon carbide semiconductor device of claim 1, wherein the maximum impurity concentration of the channel control zone is ranged from $1 \times 10^{17}$ cm$^{-3}$ to $1 \times 10^{20}$ cm$^{-3}$.

4. The silicon carbide semiconductor device of claim 1, wherein the second semiconductor layer is formed at a thickness ranged from 0.01 µm to 0.5 µm.

5. The silicon carbide semiconductor device of claim 1, wherein the impurity concentration of the second semiconductor layer is ranged from $1 \times 10^{15}$ cm$^{-3}$ to $1 \times 10^{20}$ cm$^{-3}$.

6. The silicon carbide semiconductor device of claim 1 being arranged to form a metal oxide semiconductor field effect transistor.

7. The silicon carbide semiconductor device of claim 1 being arranged to form an insulated gate bipolar transistor.

8. The silicon carbide semiconductor device of claim 1, wherein the silicon carbide semiconductor device has a threshold voltage greater than 1V.

9. A silicon carbide semiconductor device, comprising:
   a first semiconductor layer having a first conductivity;
   a second semiconductor layer located on the first semiconductor layer;
   an insulation layer located on the second semiconductor layer;
   a gate electrode located on the insulation layer;
   a first doping zone having a second conductivity opposite to the first conductivity and a first doping boundary and being located in the first semiconductor layer along the second semiconductor layer;
   a second doping zone having the first conductivity and a second doping boundary and being located in the first doping zone along the second semiconductor layer; and
   a third doping zone having the second conductivity and being located in the first semiconductor layer along the second semiconductor layer and abutting the second doping zone and partially overlapped with the first doping zone;
   wherein the first doping zone includes a channel control zone located along the second semiconductor layer between the first doping boundary and the second doping boundary;
   wherein the channel control zone has impurity concentration distribution increased gradually from the first doping boundary to reach a maximum value between the first doping boundary and the second doping boundary, then decreased gradually toward the second doping boundary;
   wherein the second semiconductor layer includes a plurality of epitaxy layers;
   wherein the epitaxy layers include a first channel layer which has the first conductivity and a first impurity concentration and is located on the first semiconductor layer, and a second channel layer which has a second impurity concentration and is located on the first channel layer.

10. The silicon carbide semiconductor device of claim 9, wherein the channel control zone is formed from the first doping boundary along the second semiconductor layer to the second doping boundary at a length ranged from 0.1 µm to 1 µm.

11. The silicon carbide semiconductor device of claim 9, wherein the maximum impurity concentration of the channel control zone is ranged from $1 \times 10^{17}$ cm$^{-3}$ to $1 \times 10^{20}$ cm$^{-3}$.

12. The silicon carbide semiconductor device of claim 9, wherein the second semiconductor layer is formed at a thickness ranged from 0.01 µm to 0.5 µm.

13. The silicon carbide semiconductor device of claim 9, wherein the second semiconductor layer has an impurity concentration ranged from $1 \times 10^{15}$ cm$^{-3}$ to $1 \times 10^{20}$ cm$^{-3}$.

14. The silicon carbide semiconductor device of claim 9, wherein the first impurity concentration is higher than the second impurity concentration.

15. The silicon carbide semiconductor device of claim 9, wherein the second channel layer has the first conductivity.

16. The silicon carbide semiconductor device of claim 9, wherein the second channel layer has the second conductivity.

17. The silicon carbide semiconductor device of claim 9, being arranged to form a metal oxide semiconductor field effect transistor.

18. The silicon carbide semiconductor device of claim 9 being arranged to form an insulated gate bipolar transistor.

19. The silicon carbide semiconductor device of claim 9, wherein the silicon carbide semiconductor device has a threshold voltage greater than 1V.

* * * * *